United States Patent [19]

Buscaglia et al.

[11] Patent Number: 4,570,090
[45] Date of Patent: Feb. 11, 1986

[54] HIGH-SPEED SENSE AMPLIFIER CIRCUIT WITH INHIBIT CAPABILITY

[75] Inventors: Carl U. Buscaglia, Poughkeepsie, N.Y.; Lawrence E. Knepper, Boca Raton, Fla.

[73] Assignee: International Business Machines Corporation, Armonk, N.Y.

[21] Appl. No.: 509,676

[22] Filed: Jun. 30, 1983

[51] Int. Cl.[4] .............................................. H03K 17/62
[52] U.S. Cl. ................................... 307/530; 307/362; 307/495
[58] Field of Search ............... 307/441, 443, 455, 470, 307/350, 354, 362-363, 530, 299 A, 467, 495; 365/155, 205

[56] References Cited

U.S. PATENT DOCUMENTS

| | | | |
|---|---|---|---|
| 3,473,149 | 10/1969 | Ashley | 340/147 |
| 3,594,590 | 7/1971 | Smith | 307/254 X |
| 3,617,772 | 11/1971 | Tertel | 307/247 |
| 3,760,194 | 9/1973 | Lutz et al. | 307/530 |
| 3,789,243 | 1/1974 | Donofrio et al. | 307/530 |
| 4,099,070 | 7/1978 | Reinert | 307/350 X |
| 4,125,877 | 11/1978 | Reinert | 365/190 |
| 4,193,127 | 3/1980 | Gersbach | 365/174 |
| 4,287,575 | 9/1981 | Eardley et al. | 365/174 |
| 4,375,039 | 2/1983 | Yamauchi | 307/530 |

FOREIGN PATENT DOCUMENTS

0079219 5/1983 European Pat. Off. ............ 205/

OTHER PUBLICATIONS

Chen et al., "Sense Amplifier for Double Density Array", IBM Tech. Disc. Bull., vol. 24, No. 11A, Apr. 1982, pp. 5651-5653.

Chen, "Bit-Select Sense Amplifier", IBM Tech. Disc. Bull., vol. 24, No. 11A, Apr. 1982, pp. 5654-5656.

Primary Examiner—John S. Heyman
Assistant Examiner—D. R. Hudspeth
Attorney, Agent, or Firm—Sughrue, Mion, Zinn, Macpeak, and Seas

[57] ABSTRACT

A sense amplifier circuit for use with a directory memory chip in which the output of a corresponding memory cell is sensed and output signals representing the sensed bit state are provided to first and second output ports. The signal provided to the first output port can be selectively inhibited, although, when not inhibited, the signals applied to the first and second output ports occur simultaneously. The inhibiting function may be performed by a dual-emitter circuit and switchable current source in one of two sense amplifiers.

15 Claims, 5 Drawing Figures

HIGH-SPEED SENSE AMPLIFIER CIRCUIT WITH INHIBIT CAPABILITY

BACKGROUND OF THE INVENTION

The invention pertains to a high-speed sense amplifier. Particularly, the invention pertains to such a sense amplifier adapted for use with a directory memory array "chip".

Referring to FIG. 1 of the drawings, a block diagram of a typical directory chip is shown. Data inputted first to either of two registers 11 and 12 (registers A and B) is directed by a write logic circuit to a selected one of arrays 0 to 3, which together make up a memory block 17. Steering of the data from the write logic circuit 14 to the various arrays of the memory block 17 is done under control of the write select circuit 13. As indicated in the drawings, each of the registers 11 and 12 may be nine bits wide, although any desired practical number can be utilized. Accordingly, each of the arrays 0 to 3 is also nine bits wide. The arrays 0 to 3 each store 32 nine-bit bytes of data. The array location where a particular byte of data is to be stored or read out is indicated by a word decoder 16.

The nine-bit outputs from the arrays 0 to 3 are fed to an input port of a byte select circuit 22. The byte select circuit 22 functions both as a sense amplifier circuit for each of the arrays 0 to 3 and as a data driver circuit for driving the sensed signals and applying them to a compare logic circuit 21 and a set of data drivers 24. More specifically, it is the function of the byte select circuit 22 to sense the output of memory cells designated by the output of the word decoder 16, transmit data to the compare logic 21 directly representing the corresponding sensed bit states or levels (the terms "state" and "level" are used interchangeably throughout the present application), and to transmit to the data drivers 24, on a bus 25, data bits $DB_0$ to $DB_8$ which correspond to the output of only one of the arrays 0 to 3, particularly, one of the arrays 0 to 3 specified by the output of a read decode circuit 18.

The compare logic circuit 21 compares the nine-bit bytes from each of arrays 0 to 3 as sensed and transmitted by the byte select circuit 22 with a single nine-bit ($CD_0$ to $CD_8$) byte of comparison input data provided through a compare input circuit 19 on a bus 29. A single bit indicative of the result of each nine-bit comparison is generated by the compare logic circuit 21 and applied to compare drivers 27 which provide corresponding drive signals on a bus 8. The data drivers 24 select as an output onto an output bus 15 either the output of the byte select circuit 22 or the comparison input data on the bus 29 from the output of the compare input circuit 19. The selection is made in accordance with the output of a bypass select circuit 23, which in turn makes the selection based upon the state of a bypass signal BPS.

It is with the byte select circuit 22 that the invention is most closely related. Referring now to the block diagram of FIG. 2, an alternative approach (as disclosed in U.S. Pat. No. 4,460,984 and assigned in common with the present application) for constructing the byte select circuit 22 is depicted. Circuitry for one of 36 bit positions is shown; the circuitry for the other bit positions would be essentially identical.

The output from each bit position of each of the arrays is in the form of two bit lines per memory cell. More specifically, when a memory cell 31-0 to 31-n is being sensed, one of bit lines $B0_n$ and $B1_n$ will carry a current in the direction of a sense amplifier 32. That is, one, but not both, of the lines $B0_n$ and $B1_n$ will carry current to indicate whether the corresponding memory cell stores a logical 0 or logical 1, respectively. The output of the sense amplifier 32, specifically, compare bits $C0_n$ and $C1_n$, are applied to an exclusive-OR circuit 33, which is one of 36 such circuits in the compare logic 21. The exclusive-OR circuit 33 compares the data bit indicated by the relative states of $C0_n$ and $C1_n$ with a corresponding comparison input bit from the bus 29. The output of the sense amplifier 32 is also coupled to an input port of an inhibit logic circuit 34. Depending on the state or level of an INHIBIT signal applied to the inhibit logic circuit 34, a single-bit signal $D_n$, which has a voltage level determined by which of $C0_n$ and $C1_n$ is active, is selectively applied to the input of a driver circuit 36. That is, if the INHIBIT signal is in the 0 state, the inhibit logic circuit 34 inhibits the communication of its output bit $D_n$ to the input of the driver 36, while if the INHIBIT signal is in the logical 1 state, the inhibit logic circuit 34 is made to transmit the bit $D_n$ to the input of the driver circuit 36. Outputs of inhibit logic circuits 34 for like-ordered bits of each of the four bytes are wired-OR at the input of the driver 36. Of course, only one of the inhibit logic circuits 34 out of the four like-ordered inhibit logic circuits can be permitted to transmit its output bit to the driver 36 at any one time. The driver 36 produces, for each output bit $DB_n$ two signals, $DB0_n$ and $DB1_n$, one of which is activated (in the UP state) to indicate the state of the bit $DB_n$.

Referring now to the schematic diagram of FIG. 3, the construction of the portion of the byte select circuit 22 shown in FIG. 2 will be explained in detail. The sense amplifier 32 is composed of a differential amplifier formed by transistors 51 and 52, the outputs of which are amplified and buffered by corresponding emitter-follower connected transistors 54 and 56. A transistor 53 provides a reference voltage to the bases of the transistors 51 and 52. The output lines $B0_n$ and $B1_n$ from the corresponding bit of the respective memory array are applied to the emitters of the transistors 51 and 52, respectively. The signals $C0_n$ and $C1_n$ are generated at the emitter outputs of the transistors 54 and 56, respectively. These are applied, as shown in FIG. 2, directly to the exclusive-OR circuit 33. Also, $C0_n$ and $C1_n$ are applied to bases of respective transistors 57 and 58, which are connected in a differential amplifier configuration within the inhibit logic circuit 34. A constant current is supplied to the commonly connected emitters of the transistors 57 and 58 from a current source transistor 60 through a current switch transistor 59. A reference for the transistor 60 is supplied through transistors 62 and 63.

An emitter-follower coupled transistor 61 receives at its base the output from the collector of the transistor 58. The signal $D_n$ is thereby produced at the emitter of the transistor 61. A current switch transistor 55 is connected between the collector of the transistor 58 and base of the transistor 61, on one hand, and the collector of the current source transistor 60 on the other. The INHIBIT signal is applied to the base of the transistor 55. If the INHIBIT signal is in the DOWN logic state, that is, if INHIBIT is more negative than $V_{REF}$, the transistor 55 is turned off, permitting the current generated through the transistor 60 to flow through the transistor 59, hence activating the differential amplifier circuit formed by the transistors 57 and 58. On the other hand, if INHIBIT is more positive than $V_{REF}$, the transistor 55 is turned on, thereby "stealing" the current from the transistor 59. This has the effect of shutting off the transistor 61. Hence, the signal $D_n$ is passed to the driver circuit 36 only in the case that the INHIBIT signal is in the DOWN logic state.

The driver circuit 36 is composed of a differential amplifier formed by transistors 64 and 66. The $D_n$ signal from the emitter of the transistor 61 of the inhibit logic circuit 34 is applied to the base of the transistor 66. A reference voltage, generated by a circuit composed of transistors 67, 68, 69 and 71 and associated resistors, is applied to the base of the transistor 61. $D1_n$ and $D0_n$ are generated at the emitters of the transistors 64 and 66, respectively.

Although the circuit of FIG. 2 can perform the desired basic functions of the byte select circuit 22 of FIG. 2, nevertheless, it suffers from a number of serious drawbacks. First of all, as can be readily seen from even a brief consideration of FIG. 3, the circuitry is quite complex, and it requires a considerable chip area. Secondly, the power required for operating this circuit is considerable. Thirdly, a differential delay is encountered between $C0_n$, $C1_n$ and $D0_n$, $D1_n$ due to the presence of the inhibit logic circuit 34.

Accordingly, it is an object of the present invention to provide a high-speed sense amplifier which performs the necessary functions of a byte select circuit in a directory chip, but in which the above-mentioned drawbacks have been eliminated.

SUMMARY OF THE INVENTION

These, as well as other objects of the invention, are met by a sense amplifier including means for determining a bit state of a memory cell being sensed, means for applying a first signal to a first output port having a state determined in accordance with the bit state of the sensed memory cell, means for applying a second signal, which also has its state determined in accordance with the determined bit state of the memory cell being sensed, to a second output port with the second signal being applied to the second output port substantially at the same time that the first signal is applied to the first output port, and means for selectively inhibiting the means for applying the second signal to the second output port. The bit state determining means may be implemented with first and second means for comparing an output from the memory cell with a reference signal, with the inhibiting means operating to selectively inhibit the first comparing means. The first and second comparing means are implemented as transistors having bases both coupled to a source of the reference signal, and an emitter of each receiving the output from the memory cell. Preferably, the first comparing means is a dual-emitter transistor, the first emitter of which receives the output of the memory cell and the second emitter of which is coupled to the inhibiting means. The inhibiting means may be a constant current source and a switch transistor which selectively couples the constant current source to the second emitter of the dual-emitter transistor. Of course, two such circuits should be provided in a case where the memory cell output is in the form of two lines for one bit, one of the memory cell output lines being activated in accordance with the state of the bit stored in the respective memory cell. One constant current source and corresponding switch transistor may be provided for each of a plurality of bit sensing circuits for a respective byte of data. In a preferred embodiment, the outputs at the collectors of the first and second transistors are passed through emitter-follower configured buffer transistors to the first and second output ports, respectively. With this configuration, the first signal is applied to the first output port continuously, while the second signal to the second output port can be inhibited by connecting the constant current source to the second emitter of the dual-emitter transistor.

DESCRIPTION OF THE PREFERRED EMBODIMENTS

Figure 1:
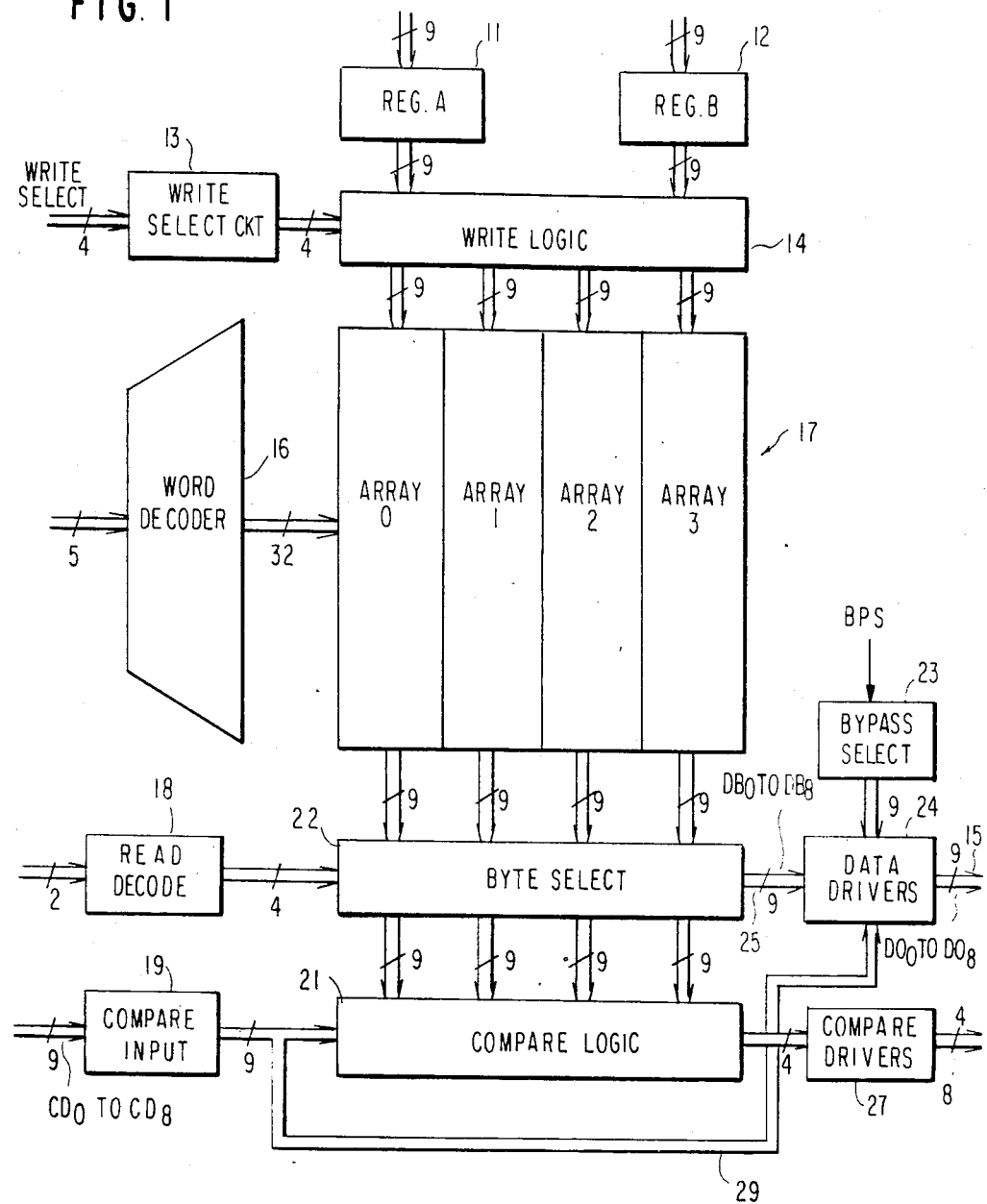
FIG. 1 is a block diagram of a directory memory chip in which the invention may be used to advantage.
Figure 2:
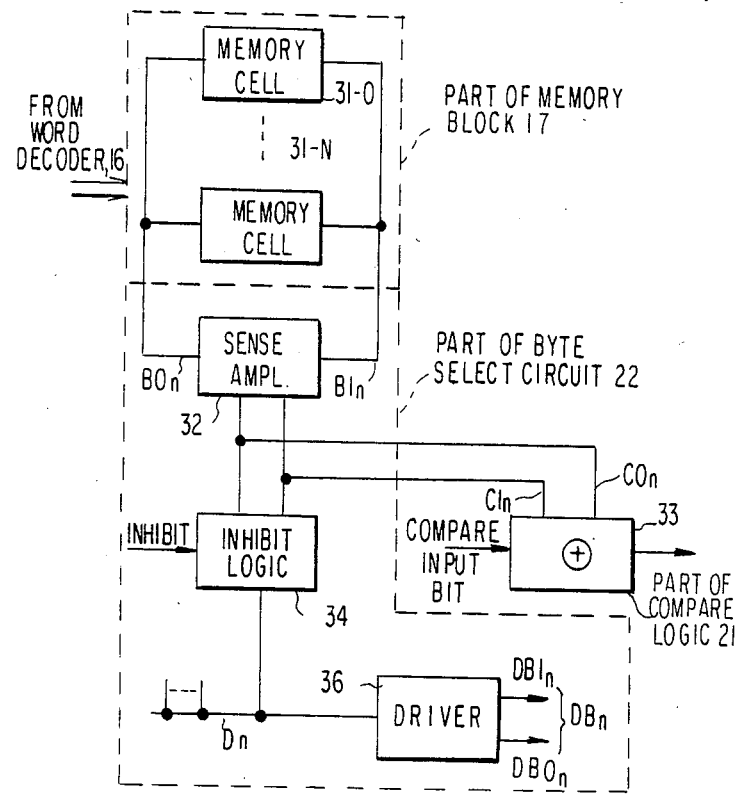
FIG. 2 is a block diagram of a single-bit portion of another implementation of a byte select circuit utilized in the directory chip of FIG. 1.
Figure 4:
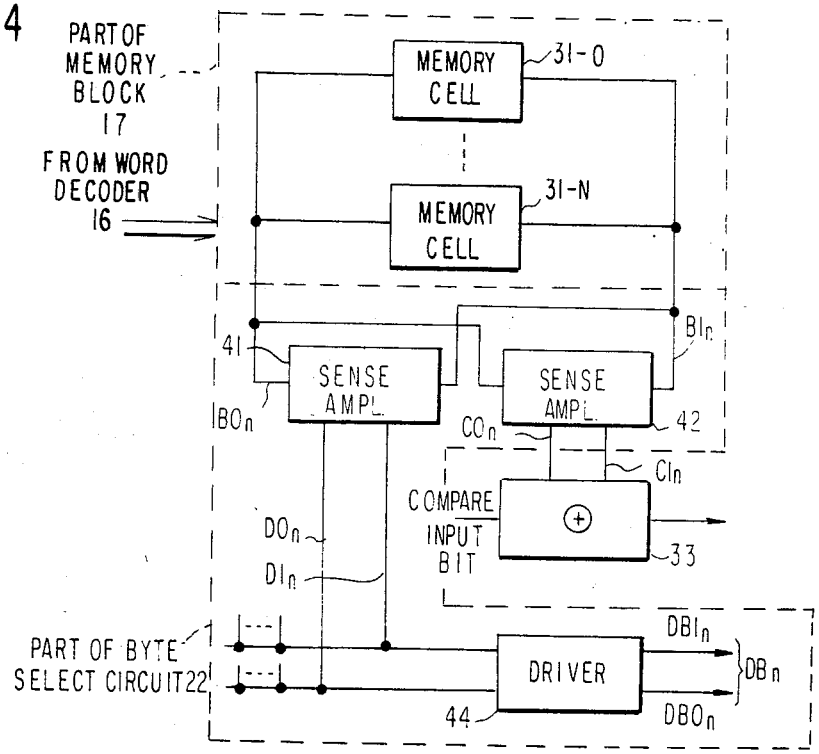
FIG. 4 is a block diagram of a single-bit portion of a byte select circuit of the present invention.

With reference to FIG. 4, a block diagram of a sense amplifier circuit of the invention is shown. In accordance with the invention, two sense amplifiers 41 and 42 both receive the outputs $B0_n$ and $B1_n$ from the memory cells. The output of the sense amplifier 41, dual-bit signals $D0_n$ and $D1_n$, is applied to the input of a driver 44 and wired-OR with outputs of corresponding sense amplifiers 41 for like-ordered bits of the four bytes. The output of the sense amplifier 42, the uninhibited output signals $C0_n$ and $C1_n$, are applied to the exclusive-OR circuit 33.

Figure 5:
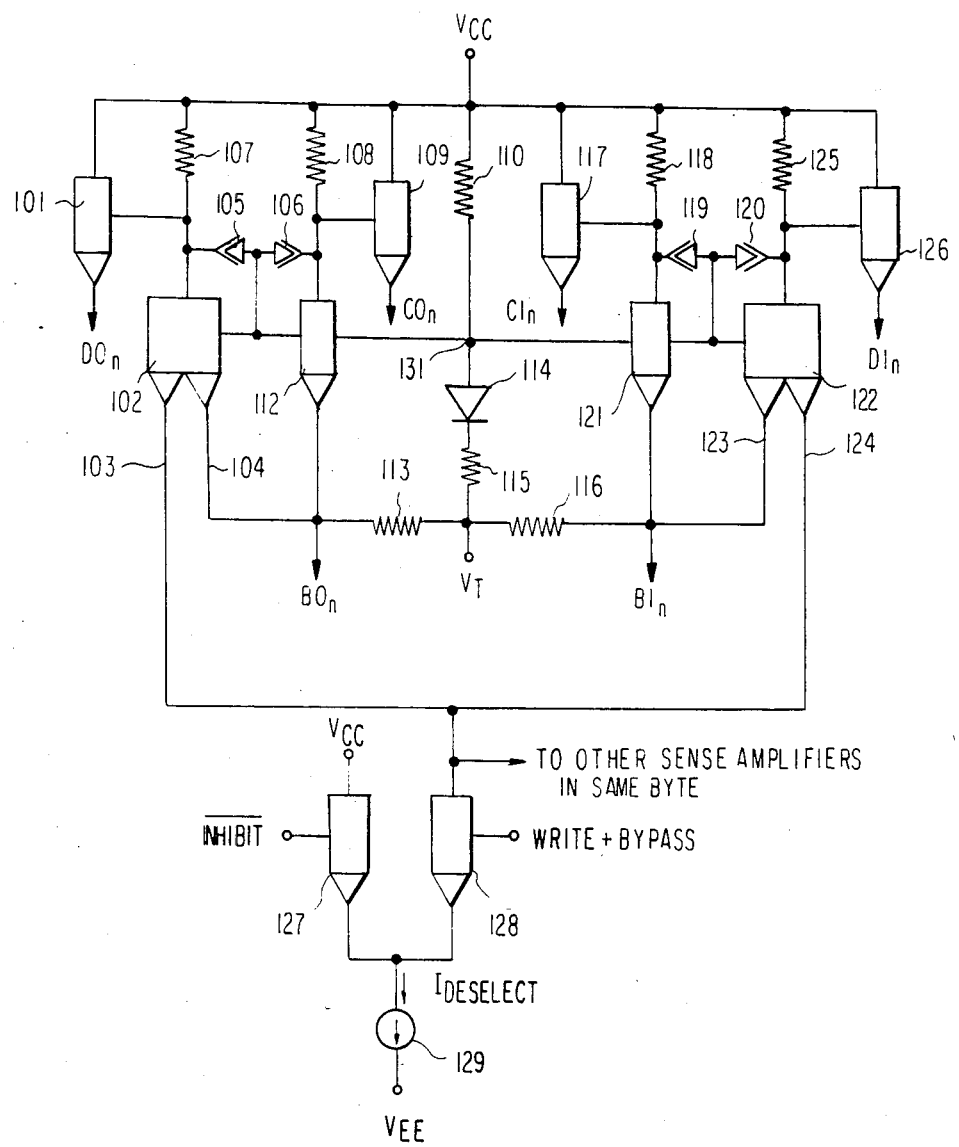
FIG. 5 is a detailed circuit diagram of the portion of the byte select circuit shown in FIG. 4.

With reference now to the detailed schematic diagram of FIG. 5, low-state output line $B0_n$ from a sensed memory cell is applied to the emitter of a first transistor 112 and to one emitter of a dual-emitter transistor 102. Similarly, the high-state output bit line $B1_n$ from the memory cell is applied to the emitter of a transistor 121 and to a first emitter of a second dual-emitter transistor 122. Bias currents are supplied through respective resistors 113 and 116. A reference voltage is applied on a node 131 to the bases of all of transistors 102, 112, 121 and 122. The circuit for generating the reference potential includes resistors 110 and 115 and a diode 114. The collectors of each of the transistors 102, 112, 121 and 122 are coupled through corresponding resistors 107, 108, 118 and 125 to a positive power source terminal at a voltage $V_{CC}$. Emitter-follower configured transistors 101, 109, 117 and 126 buffer and amplify the outputs on the collectors of the transistors 102, 112, 121 and 122, respectively. Specifically, the always-available outputs $C0_n$ and $C1_n$ are produced at the emitters of the transistors 109 and 117, respectively, while the inhibitable outputs $D0_n$ and $D1_n$ are produced at the emitters of the transistors 101 and 126, respectively. The second emitters 103 and 124 of the dual-emitter transistors 102 and 122 are connected to the collector of a current switch transistor 128, the emitter of which is applied to a constant current source 129. The base of the transistor 128 receives a control signal WRITE+BYPASS. A second current switch transistor 127 is connected between $V_{CC}$ and the current source 129. The base of the transistor 127 receives an $\overline{\text{INHIBIT}}$ signal. Together, the $\overline{\text{IN}}$ $\overline{\text{HIBIT}}$ and WRITE+BYPASS signals constitute inhibit control signals.

In operation, if the transistor 128 is turned off, that is, if the WRITE+BYPASS signal is at the DOWN level and the $\overline{\text{INHIBIT}}$ signal at the UP level, no current is drawn from the second emitters 103 and 124 of the transistors 102 and 122. In that case, when a memory cell is being read out, one of $B0_n$ and $B1_n$ will draw current through its corresponding pair of transistors 102 and 112 or 121 and 122, respectively. Assuming, for instance, that a current flows on the line $B0_n$, this current will be equally divided between the emitter of the transistor 112 and the emitter 104 of the transistor 102. Correspondingly, the potentials at the collectors of the transistors 102 and 112 are pulled negatively, thereby setting the signals $D0_n$ and $C0_n$ in the DOWN state. In the case that $B0_n$ carries current, $B1_n$ will carry no current. Thus, the collectors of the transistors 121 and 122 will then remain positive, thereby setting the signals $C1_n$ and $D1_n$ in the UP state. Of course, if $B1_n$ carries current and $B0_n$ carries no current, the situation will be reversed, that is, the signals $C1_n$ and $D1_n$ will be in the DOWN state and the signals $C0_n$ and $D0_n$ will be in the UP state.

If it is desired to inhibit transmission of the outputs $D0_n$ and $D1_n$ to the data bus 25, the transistor 128 is turned on by raising the WRITE+BYPASS signal to the UP state and setting the $\overline{\text{INHIBIT}}$ signal in the low state. This switches a current $I_{DESELECT}$ from the transistor 127 to the transistor 128. The current flowing through the transistor 128 is drawn equally from the emitters 103 and 124 of the dual-emitter transistors 102 and 122. The effect is to pull down the collectors of these transistors, hence turning off the transistors 101 and 126, regardless of the state of the memory output lines $B0_n$ and $B1_n$.

Figure 3:
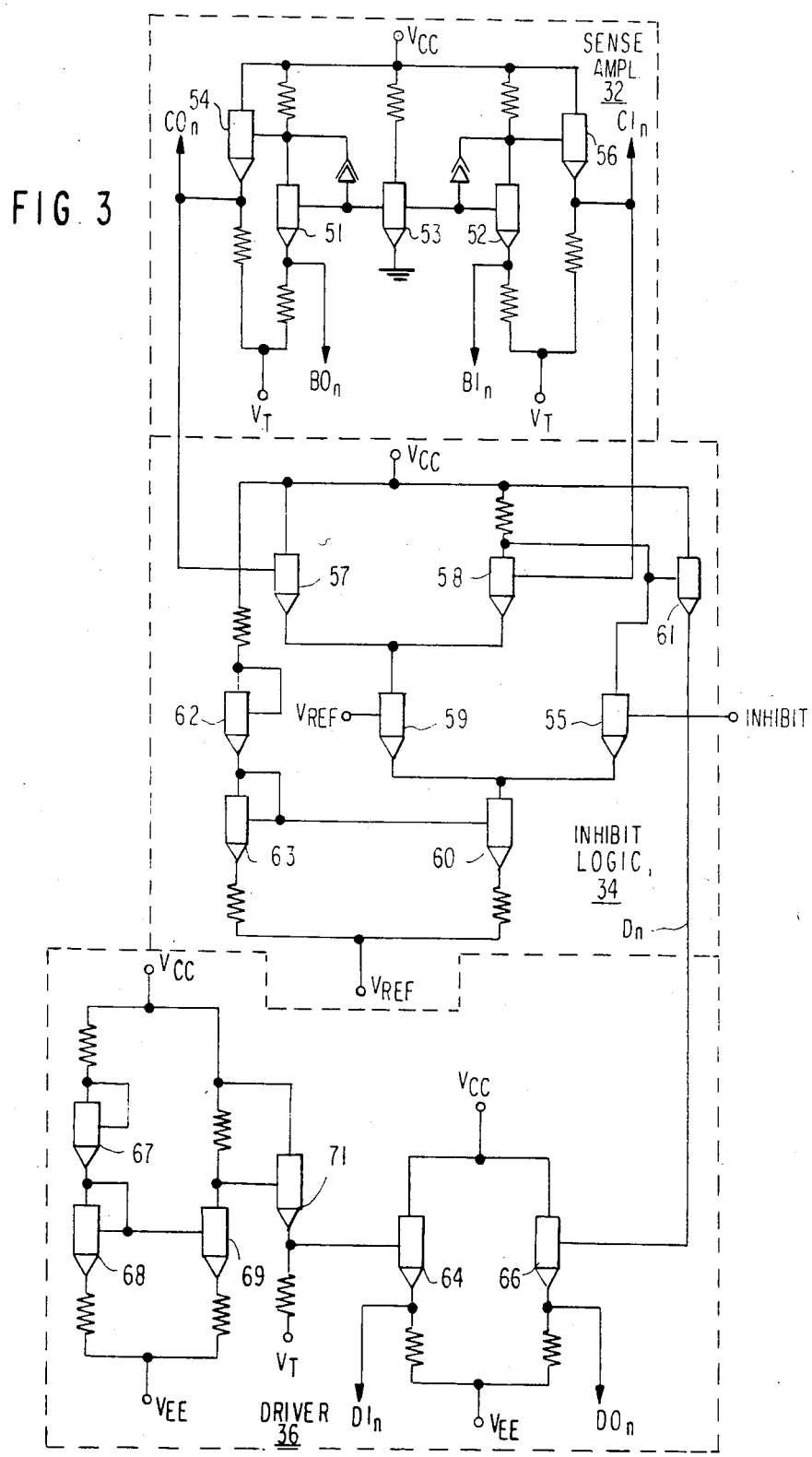
FIG. 3 is a detailed schematic diagram of the portion of the byte select circuit shown in FIG. 2.

The inventive circuit of FIG. 5 performs all of the functions of the prior art arrangement of FIG. 3, yet eliminates each of the above-mentioned drawbacks. Specifically, the circuit of FIG. 5 is clearly much simpler than that of FIG. 3, it requires much less chip area, draws much less power than the prior art configuration, and is faster. Also, it may be appreciated that the path from the input lines from the memory cell to the output lines $D0_n$, $D1_n$ and $C0_n$, $C1_n$ are similar. Thus, there is no significant differential delay between the inhibited and uninhibited data output ports.

This completes the description of the preferred embodiments of the invention. Although preferred embodiments have been described, it is believed that numerous alterations and modifications thereto would be apparent to one of ordinary skill in the art without departing from the spirit and scope of the invention.

We claim:

1. A sense amplifier circuit comprising:
   means for determining a bit level of a memory cell being sensed;
   means for applying a first, constantly available signal to a first output port having a level determined in accordance with the determined bit level of said memory cell;
   means for applying a second, inhibitable signal to a second output port having a level determined in accordance with the determined bit level of said memory cell simultaneously with application of said first signal to said first output port; and
   means for selectively inhibiting said means for applying said second signal to said second output port.

2. The sense amplifier of claim 1, wherein said means for determining said bit comprises first and second means for comparing an output from said memory cell with a reference signal, and wherein said inhibiting means comprises means for inhibiting said first comparing means.

3. The sense amplifier of claim 2, wherein said first and second comparing means each comprise a transistor having a base coupled to a source of said reference signal, and an emitter receiving said output from said memory cell.

4. The sense amplifier of claim 3, wherein said transistor of said first comparing means comprises a dual-emitter transistor having a first emitter receiving said output from said memory cell and a second emitter coupled to said inhibiting means.

5. The sense amplifier of claim 4, wherein said inhibiting means comprises means for selectively drawing a constant current from said second emitter in response to an inhibit control signal.

6. The sense amplifier of claim 2, wherein said means for applying said first signal to said first output port and said means for applying said second signal to said second output port comprise emitter-follower transistor circuits having inputs coupled to outputs of said first and second comparing means respectively.

7. A sense amplifier circuit comprising:
   first and second transistors having emitters coupled together, and collectors resistively coupled to a first power source terminal, said coupled emitters of said first and second transistors being coupled to an output of a memory cell being sensed;
   means for supplying a reference signal to bases of said first and second transistors;
   third and fourth transistors having bases coupled to collectors of said first and second transistors, respectively, collectors coupled to a second power source terminal, and emitters coupled to first and second output terminals, respectively, and;
   means for selectively drawing current through said first transistor in response to at least one inhibit control signal.

8. The sense amplifier circuit of claim 7, wherein said first transistor comprises a dual-emitter transistor, a first emitter of said first transistor being coupled to said emitter of said second transistor and a second emitter of said first transistor being coupled to said means for selectively drawing current through said first transistor.

9. The sense amplifier circuit of claim 8, wherein said means for selectively drawing current through said first transistor comprises a switchable constant current source operating in response to said at least one inhibit control signal.

10. The sense amplifier of claim 8, wherein said means for selectively drawing current through said first transistor comprises: a constant current source; a fifth transistor having a collector coupled to said second emitter of said first transistor, an emitter coupled to said constant current source, and a base receiving a first of said at least one inhibit control signal; and a sixth transistor having a collector coupled to a positive power source terminal, an emitter coupled to said emitter of said fifth transistor, and a base receiving a second of said inhibit control signals.

11. A sense amplifier circuit comprising:
   a plurality of bit sense circuits, each of said bit sense circuits comprising: a first transistor having an emitter coupled to a low-level output line of a memory cell being sensed, and a collector coupled through a first resistor to a positive power source terminal; a second, dual-emitter transistor having a collector coupled through a second resistor to said positive power source terminal, a base coupled to a base of said first transistor, a first emitter coupled to said emitter of said first transistor, and a second emitter coupled to an inhibit control signal node; a third transistor having a collector coupled to said positive power source terminal, a base coupled to said collector of said first transistor, and an emitter coupled to a first low-level output terminal; a fourth transistor having a collector coupled to said positive power source terminal, a base coupled to said collector of said second transistor, and an emitter coupled to a second low-level output terminal; a fifth transistor having an emitter coupled to a high-level output line of said memory cell, and a collector coupled through a third resistor to said positive power source terminal; a sixth, dual-emitter transistor having a collector coupled through a fourth resistor to said positive power source terminal, a base coupled to a base of said fifth transistor, a first emitter coupled to said emitter of said fifth transistor, and a second emitter coupled to said node; a seventh transistor having a collector coupled to said positive power source terminal, a base coupled to said collector of said sixth transistor, and an emitter coupled to a first high-level output terminal; an eighth transistor having a collector coupled to said positive power source terminal, a base coupled to said collector of said fifth transistor, and an emitter coupled to a second high-level output terminal; and a reference voltage source for supplying a reference voltage to said bases of said first, second, fifth and sixth transistors; and
a constant current source switchably connected to said node, whereby, when said constant current source is connected to said node, current is drawn through said second and fifth transistors via said second emitters thereof to inhibit said third and seventh transistors from communicating a data bit to said first low-level and high-level output terminals, respectively, and when said constant current source is disconnected from said node, said third and seventh transistors are free to communicate a data bit signal to said first low-level and high-level output terminals, respectively.

12. The sense amplifier of claim 11, wherein said constant current source comprises first and second current switch transistors for selectively connecting and disconnecting said constant current source from said node in response to first and second inhibit signals.

13. The sense amplifier of claim 11, wherein said reference voltage source comprises a fifth resistor coupled between said positive power source terminal and said bases of said first, second, fifth and sixth transistors, a diode having an anode terminal coupled to said bases of said first, second, fifth and sixth transistors, and a sixth resistor coupled between a cathode terminal of said diode and a reference voltage terminal to which is applied a reference voltage lower than a potential at said positive power source terminal.

14. The sense amplifier of claim 13, further comprising seventh and eighth resistors coupled between said reference voltage terminal and said emitters of said first and fifth transistors.

15. A sense amplifier circuit, comprising:
means for determining a bit level of a memory cell being sensed;
means for applying a first signal to a first output port having a level determined in accordance with the determined bit level of said memory cell;
means for applying a second signal to a second output port having a level determined in accordance with the determined bit level of said memory cell simultaneously with application of said first signal to said first output port; and
means for selectively inhibiting means for applying said second signal to said second output port, whereby said second signal may be inhibited independently of said first signal and said means for applying said first signal to said first output port.

* * * * *